(12) United States Patent
Dalla Piazza et al.

(10) Patent No.: US 7,084,556 B1
(45) Date of Patent: *Aug. 1, 2006

(54) SMALL-SIZED PIEZOELECTRIC RESONATOR

(75) Inventors: Silvio Dalla Piazza, St-Imier (CH); Bruno Studer, Riedholz (CH); Thomas Luethi, Grenchen (CH)

(73) Assignee: ETA SA Manufacture Horlogere Suisse, Grenchen (CH)

( * ) Notice: Subject to any disclaimer, the term of this patent is extended or adjusted under 35 U.S.C. 154(b) by 0 days.

This patent is subject to a terminal disclaimer.

(21) Appl. No.: 11/148,440

(22) Filed: Jun. 9, 2005

(51) Int. Cl.
*H01L 41/08* (2006.01)
(52) U.S. Cl. ....................................... 310/370
(58) Field of Classification Search ................. 310/370
See application file for complete search history.

(56) References Cited

U.S. PATENT DOCUMENTS

| | | | |
|---|---|---|---|
| 4,384,232 A | 5/1983 | Debely | |
| 4,920,296 A * | 4/1990 | Takahashi et al. | 310/348 |
| 6,194,817 B1* | 2/2001 | Yachi et al. | 310/370 |
| 6,700,313 B1* | 3/2004 | Dalla Piazza et al. | 310/370 |
| 2004/0085163 A1 | 5/2004 | Kikushima | |
| 2004/0145281 A1 | 7/2004 | Kikuchi et al. | |
| 2005/0040737 A1* | 2/2005 | Tanaya | 310/370 |
| 2005/0062368 A1* | 3/2005 | Hirasawa et al. | 310/370 |

FOREIGN PATENT DOCUMENTS

| | | |
|---|---|---|
| DE | 199 02 339 A1 | 7/1999 |
| GB | 1 391 213 | 4/1975 |

* cited by examiner

*Primary Examiner*—Mark Budd
(74) *Attorney, Agent, or Firm*—Sughrue Mion, PLLC

(57) ABSTRACT

The piezoelectric resonator according to the invention includes a tuning fork shaped part with two parallel vibrating arms, connected to each other by a linking part, from which protrude a central arm located between both vibrating arms of the tuning fork shaped part, wherein at least one groove is formed on at least one of a front side and a rear side of each vibrating arm.

20 Claims, 11 Drawing Sheets

SMALL-SIZED PIEZOELECTRIC RESONATOR

FIELD OF INVENTION

The present invention concerns piezoelectric resonators and more particularly resonators of small dimensions which are most often used for making frequency generators in particular for portable electronic equipment, in numerous fields such as horology, information technology, telecommunications and the medical field.

BACKGROUND OF THE INVENTION

Figure 13:
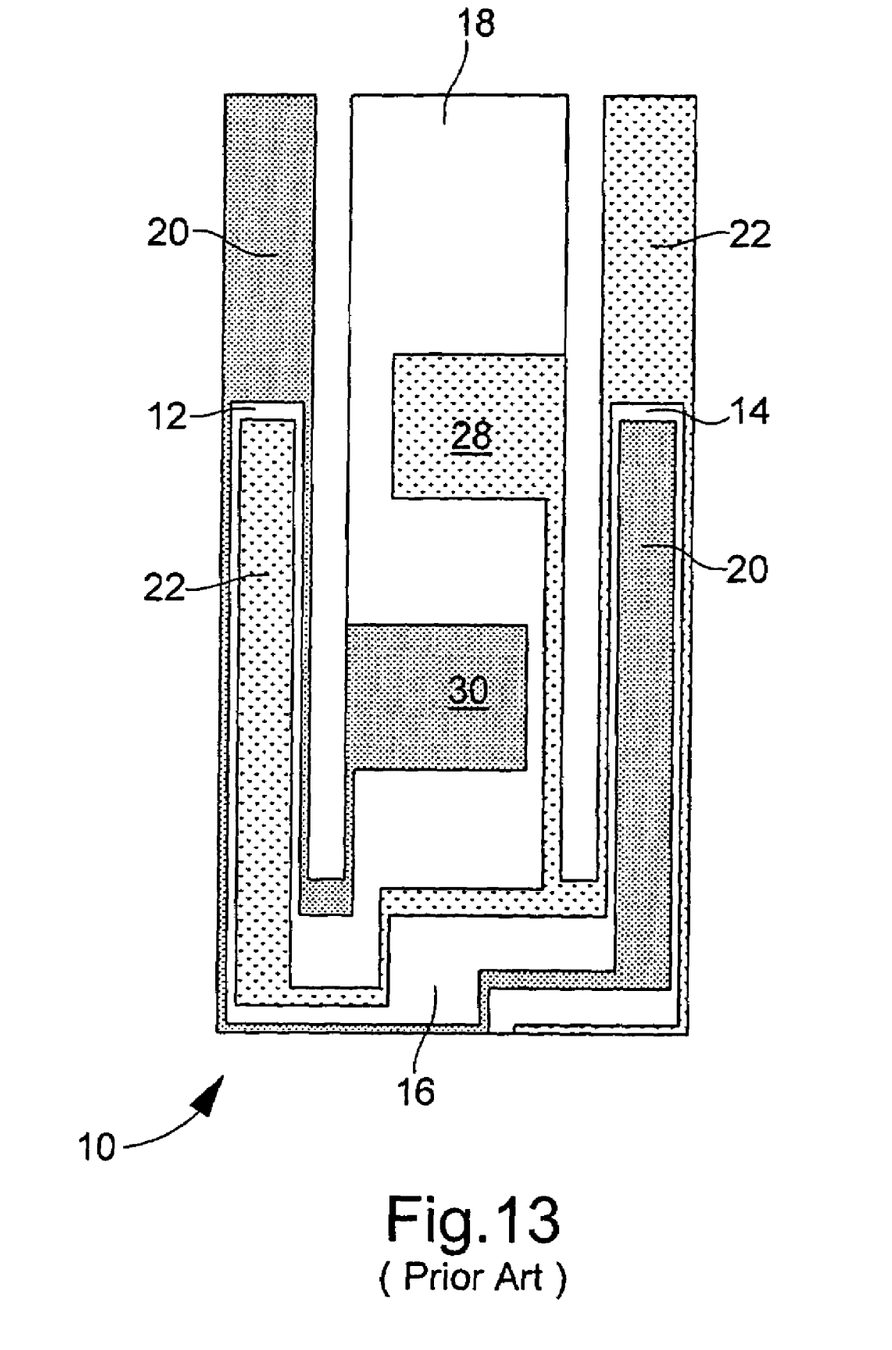
FIG. 13, already described, is a top view of a piezoelectric resonator according to the prior art.

Such a resonator of small dimensions has been disclosed in the prior art document U.S. Pat. No. 6,700,313 filed in the name of the name Assignee, which is enclosed herewith by way of reference. Resonator 10 represented on FIG. 13, which is intended to be mounted in a case, includes a tuning fork shaped part with two parallel arms 12, 14 connected to each other by a linking part 16 and carrying electrodes 20, 22 to make them vibrate, these electrodes being connected to connecting pads 28, 30 intended to be electrically connected to the exterior of the case. Resonator 10 also includes a central arm 18 attached to linking part 16 and located between arms 12, 14 of the tuning fork shaped part, substantially equidistant from them, this central arm 18 having a greater mass than that of the arms of the tuning fork shaped part and connected pads 28, 30 are carried by this central arm. This resonator is mounted in a case of parallelepiped shape by fixing its central arm 18 to at least one support secured to the bottom of the case.

The above described kind of resonators, called hereinafter three arm resonators, allows breaking away from many problems encountered with conventional tuning fork resonators.

One of these problems is that the dimensional and functional features of the conventional tuning fork resonators are optimised for mounting them in metallic cases and not in ceramic cases. For example, the ratio between their length and their width is ill suited to the manufacture of such cases, in particular when the cases are of the SMD (Surface Mounting Device) type, i.e. meant to be automatically mounted on hole-free printed circuit boards. Because of this, a conventional tuning fork resonator and its connection to the case do not have very good resistance to shocks.

Further conventional tuning fork resonators are liable to tip towards the bottom of the case when it is fixed onto a step of the case.

Furthermore, since the thermal expansion coefficients of ceramic material and quartz are different enough to create mechanical stresses in the resonator which can not only be felt in the arms of the tuning fork and disturb the working of the resonator when the temperature changes but can also break the solder or detach connection pads of the resonator from those of the case and alter or even cut the electric connection between the resonator electrodes and the external contact pads of the case.

For the same reason, if there is an incipient fracture on the side of base of the tuning fork where connection pads are situated, a significant temperature variation can even break the tuning fork.

Finally, when the resonator is vacuum packed, the vacuum is never perfect and the stirring of the atmosphere by the tuning fork arms when the resonator vibrates can modify the operating parameters of the resonator when its arms come close to each other, more so than in the case of a metallic case.

Thus, three arm resonators enable satisfactory solutions to be brought to the various problems posed by conventional tuning fork resonators. Nevertheless although these three arm resonators have proved to be advantageous, miniaturization requirements as well as energy consumption required to maintain vibrations of the tuning fork are always critical issues for mobile phone or wristwatch applications.

SUMMARY OF THE INVENTION

The main goal of the invention is to provide a three arm resonator which enables to reduce consumption of energy by producing an excitation electrical field which is more homogeneous and locally more intense and for which vibration loss at the arms is low even when the size of the vibrating piece is miniaturized and the Cl value (crystal impedance or equivalent series resistance) can also be suppressed at a low level.

For that purpose according to a first aspect of the invention, it concerns a piezoelectric resonator including a tuning fork shaped part with two parallel vibrating arms, connected to each other by a linking part, from which protrude a central arm located between both vibrating arms of the tuning fork shaped part, wherein at least one groove is formed on at least one of a front side and a rear side of each vibrating arm. Use of grooves on the vibrating arms furnishes precise performances even when the device is miniaturized.

According to another aspect of the invention, in order to increase the vibrating coupling effect of the vibrating arms, the grooves extend in the linking part. Grooves extending in the linking part where mechanical stresses are maximum, allow retrieving the electrical field in this high stressed area.

According to another aspect of the invention, in order to further optimize homogeneity of the excitation electrical field, two grooves are provided on each front and rear sides of each vibrating arms.

According to another aspect of the invention, in order to guarantee a sufficient mechanical resistance in the high stressed area, interior grooves which are located on the inside with respect to the central arm extend shorter within the linking part than the exterior grooves which are located on the outside with respect to the central arm.

According to another aspect of the invention, in order to further reduce dimensions of such a three arm resonator, in particular its length, while keeping above listed advantages, the width of said central arm is greater or equal to one and a half the width of the vibrating arms and the free end of the central arm does not extend beyond the vibrating arms.

According to another aspect of the invention, in order to guarantee an accurate and solid positioning of the resonator inside its packaging, fixing holes or recesses are arranged in the central arm.

According to another aspect of the invention, in order to reduce the dimensions of such a three arm resonator, in particular its width, the width of the central arm is about the same as that of the vibrating arms and a base part is provided at the end of the central arm opposite to the linking part.

According to another aspect of the invention, in order to guarantee an accurate and solid positioning of the resonator inside its packaging, fixing holes or recesses are arranged in the base part.

According to another aspect of the invention, in order to further reduce the dimensions of such a three arm resonator, in particular its length, the length of the central arm is less than that of the vibrating arms and the vibrating arms end in flippers extending beyond said central arm, the flipper width being larger than that of the vibrating arms.

According to another aspect of the invention, in order to further stabilize the resonator when vibrating, a balancing reed attached to the central arm extends between both flippers, width of this balancing reed being smaller than that of the central arm.

According to another aspect of the invention, in order to avoid mechanical stress on the fixing part of the resonator due to vibrations of the arms, either a decoupling hole or decoupling recesses or both are arranged through, respectively on the central arm.

According to another aspect of the invention, in order to further reduce the length of the resonator and decouple the central arm from the vibrating arms, a recess is arranged on the side of the linking part opposite to that of the central arm.

BRIEF DESCRIPTION OF THE DRAWINGS

Other features and advantages of the invention will appear upon reading the following description which refers to the annexed drawings in which.

DETAILED DESCRIPTION OF THE INVENTION

Figure 1A:
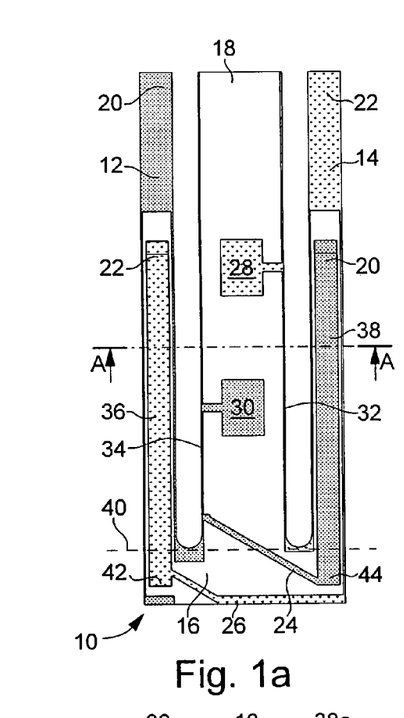
FIGS. 1a, 1b and 1c are respectively bottom, top and cut views of a first embodiment of a piezoelectric resonator according to the invention.
Figure 1B:
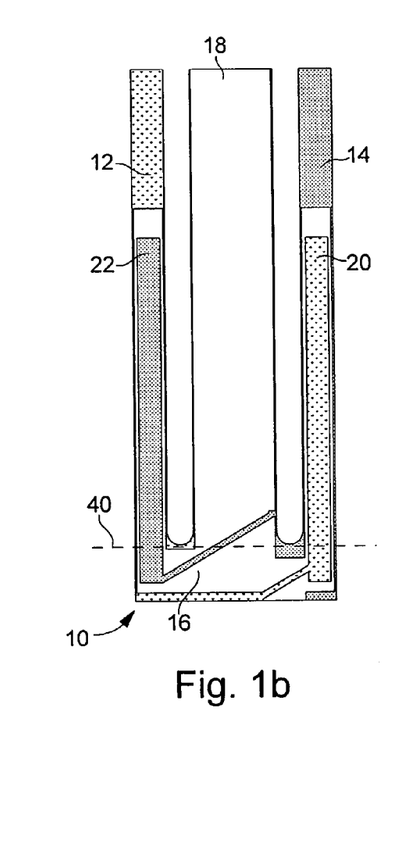
Figure 1C:
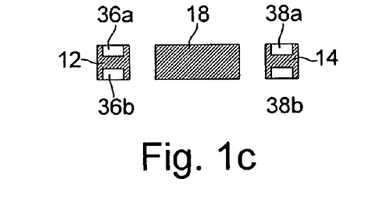

In the first embodiment shown in relation with FIGS. 1a, 1b and 1c, the resonator according to the invention, designated by the reference numeral 10, includes a tuning fork shaped part with two vibrating arms 12 and 14 joined by a linking part 16 to which a central arm 18, located between arms 12 and 14 and parallel thereto, is attached, the whole assembly being made in a single piece and of quartz.

As shown by FIGS. 1a and 1b, vibrating arms 12 and 14 carry two groups of electrodes 20 and 22, which are connected to each other by conductive paths respectively 24 and 26, carried by linking part 16 of the tuning fork shaped part. As they are shown in the drawing, these electrodes and conductive paths are disposed to make arms 12 and 14 vibrate in flexure mode, but they could have a different configuration to make the arms vibrate in the same mode or another mode (torsion, shear, etc.). Returning to central arm 18, FIG. 1a shows that it carries on its back face two conductive connection pads 28 and 30 located on either side of the centre of gravity G of the resonator lengthways and preferably equidistant from it, these pads 28 and 30 being connected by conductive paths 32 and 34 respectively to conductive paths 26 and 24 which connect the electrodes of each group 20 and 22 to each other. These pads 28 and 30 may also be used for fixing the resonator inside its packaging (not shown).

As visible in FIGS. 1a and 1b, the width of central arm 18 shall be at least slightly more than one and a half that of an arm 12 or 14 of tuning fork shaped part. Likewise, the length of central arm 18 is not necessarily equal to that of arms 12 and 14, as shown by FIGS. 1a and 1b. It could be for example shorter. However, it is important, on the one hand, that central arm 18 is substantially equidistant from arms 12 and 14, this distance being able to be equal to that which separates the arms of a conventional tuning fork resonator, and that, on the other hand, this central arm 18 has a much greater mass than that of arms 12 and 14 which have to vibrate.

In order to reduce consumption of energy by producing an excitation electrical field which is more homogeneous and locally more intense and for which vibration loss at the arms is low even when the size of the vibrating piece is miniaturized, at least one groove 36, 38 is formed on at least one of a front side and a rear side of each vibrating arm, respectively 12, 14.

As shown on FIG. 1c, each vibrating arm 12, 14 is preferably H-shaped, meaning that one groove 36a, 36b, respectively 38a, 38b is preferably provided on each the front and the rear side of each vibrating arm 12 respectively 14. It will be appreciated that depth of these grooves is preferably between 30% and 50% of the thickness of the corresponding vibrating arm in the depth direction (along axis D) and advantageously between 40% and 50%. It is to be noted that this ratio may be applicable to all forthcoming embodiments with grooves. Use of such grooves on the vibrating arms furnishes precise performances even when the device is miniaturized. Nevertheless, as an alternative only one groove may be provided either on the front or the rear side of each vibrating arm.

Advantageously, in order to further increase the vibrating coupling effect of the vibrating arms, grooves 36, 38 extend in linking part 16. Portions 42, 44 of grooves 36, 38 extending in linking part 16, virtually delimited by dotted line 40, where mechanical stresses are maximum, allow retrieving the electrical field in this high stressed area.

Figure 2A:
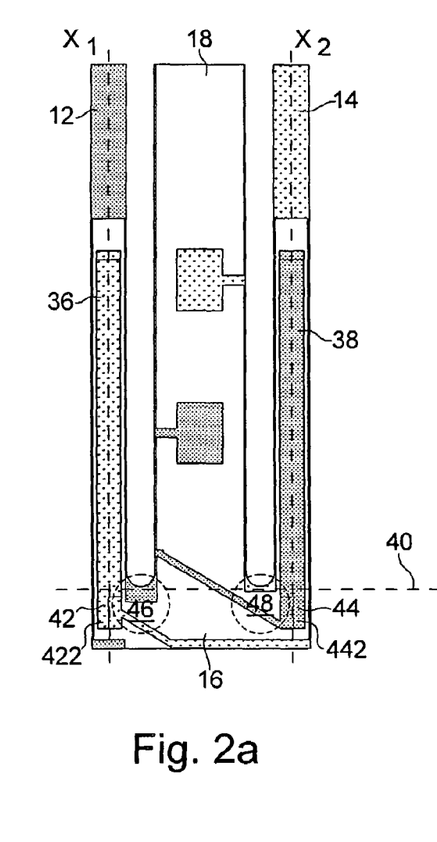
FIGS. 2a, 2b and 2c are bottom views of three variants of a second embodiment of a piezoelectric resonator according to the invention.
Figure 2B:
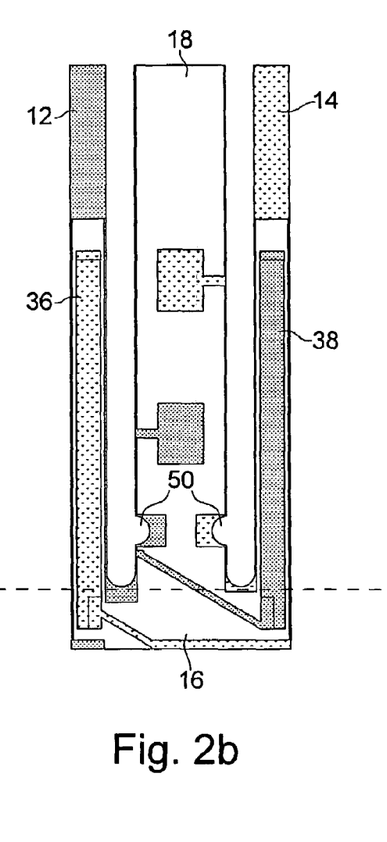
Figure 2C:
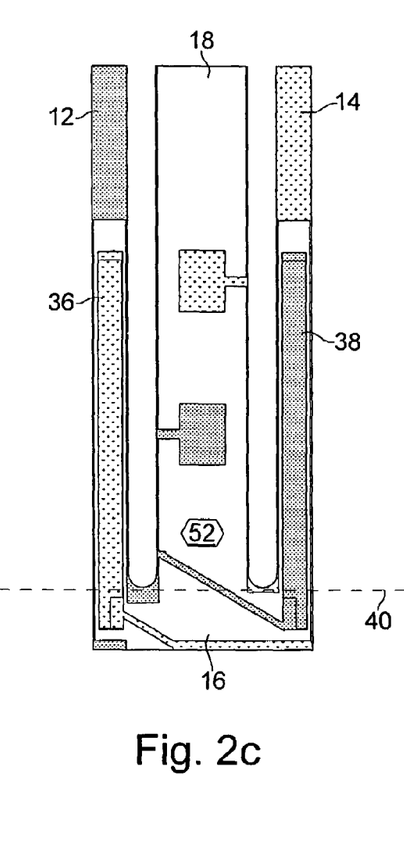

In the three variants of the second embodiment respectively illustrated in FIGS. 2a, 2b and 2c, the resonator differs from the first embodiment in that groove portions 42, 44 within linking part 16 are designed with non symmetric shapes with respect to the longitudinal axis $(X_1, X_2)$ of vibrating arms 12, 14.

In order to guarantee a better mechanical resistance of the resonator in the high stressed area than that obtained with a groove as shown in relation with the first embodiment, grooves 36, 38 are designed with a portion 422, 442 of narrowed width within linking part 16. Hollowed out portion 422, 442 of narrowed width of groove 36, 38 is located on the outside with respect to central arm 18. Thus, the quantity of material in the high mechanical stressed areas, which are illustrated by hatched zones 46 and 48 and mainly located in the linking part regions contiguous to vibrating arms 12, 14, is more important and therefore renders these areas more robust to mechanical constraints.

As shown in FIGS. 2b and 2c, decoupling means 50, respectively 52 may be arranged on central arm 18 near linking part 16 in order to mechanically decouple central arm 18 used to fix resonator 10 in its package (not shown) from vibrating arms 12 and 14. These decoupling means 50, respectively 52 have to be arranged between fixing elements of central arm 18, which are preferably conductive pads 28 and 30, and linking part 16 to which is attached vibrating arms 12 and 14. In the variant shown in FIG. 2b, the decoupling means are implemented in the form of notches 50 provided on both sides of central arm 18. These notches 50 may be rectangular-shaped, half-circle-shaped or V-shaped. In the variant shown in FIG. 2c, the decoupling means are implemented in the form of a hole 52 cut trough central arm 18. This hole may have different shapes such a rectangular, circle, or hexagonal shape. As for notches, the hole has to be hollowed out between fixing elements 28 and 30 and linking part 16. It will be appreciated that both decoupling means can be implemented together as well.

Figure 3A:
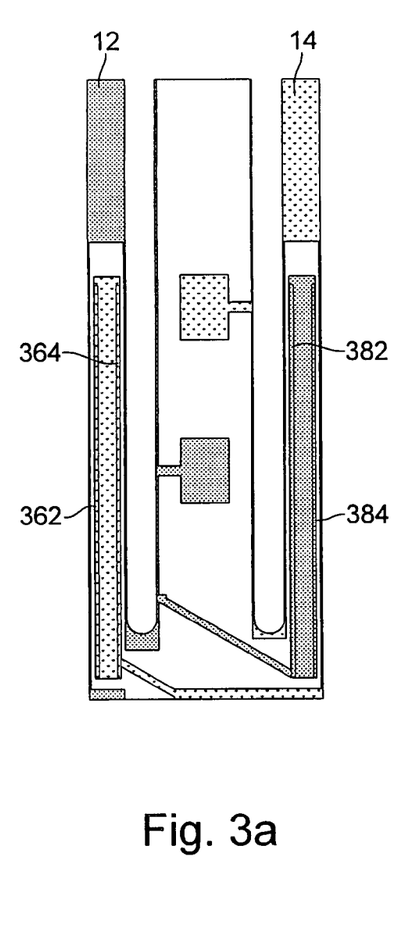
FIGS. 3a, 3b and 3c are bottom views of three variants of a third embodiment of a piezoelectric resonator according to the invention.
Figure 3B:
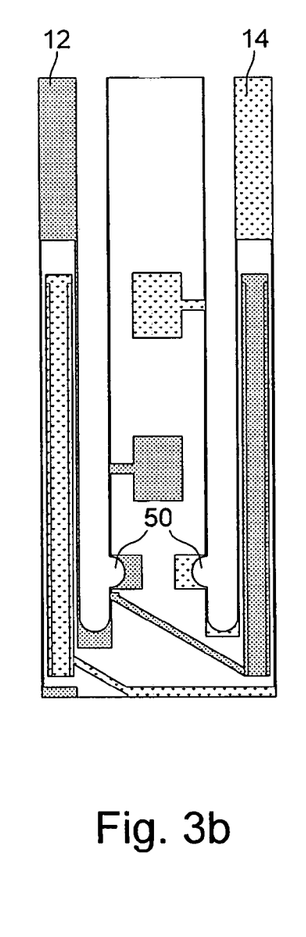
Figure 3C:
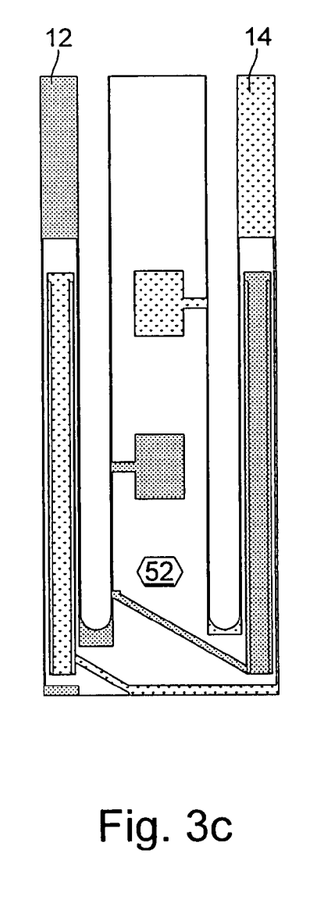

In the variants of the third embodiment respectively shown in FIGS. 3a, 3b and 3c, the resonator differs from the three variants of the second embodiment above described in that two grooves 362, 364 are arranged on each the front and the rear sides of each vibrating arm 12, 14. According to this third embodiment, grooves 362, 364, 382 and 384 advantageously extend within linking part 16 in order to maximize homogeneity of the electrical field.

One retrieves as for the second embodiment, two variants with decoupling means being located between fixing elements 28 and 30 and linking part 16 to which vibrating arms 12 and 14 are attached. These decoupling means are respectively notches 50 in FIG. 3b and a hole 52 in FIG. 3c. Once again, it will be appreciated that both variants of FIGS. 3b and 3c may be combined.

Figure 4:
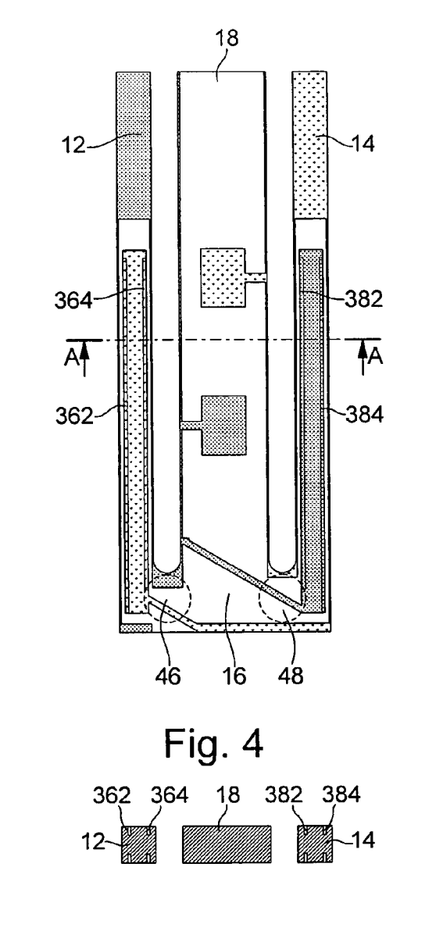
FIG. 4 is a bottom view of a fourth embodiment of a piezoelectric resonator according to the invention.

In the fourth embodiment shown in FIG. 4, the resonator differs from the one shown in FIG. 3a in that in order to guarantee a better mechanical resistance of the resonator in the high stressed areas, exterior grooves 364, respectively 382 which are located on the inside with respect to central arm 18 extend shorter within linking part 16 than interior grooves 362, respectively 384 which are located on the outside with respect to central arm 18. Thus, the quantity of material in the high mechanical stressed areas, which are illustrated by hatched zones 46 and 48 and mainly located in the linking part regions contiguous to vibrating arms 12 and 14, is more important and therefore renders these areas more robust to mechanical constraints.

Figure 5A:
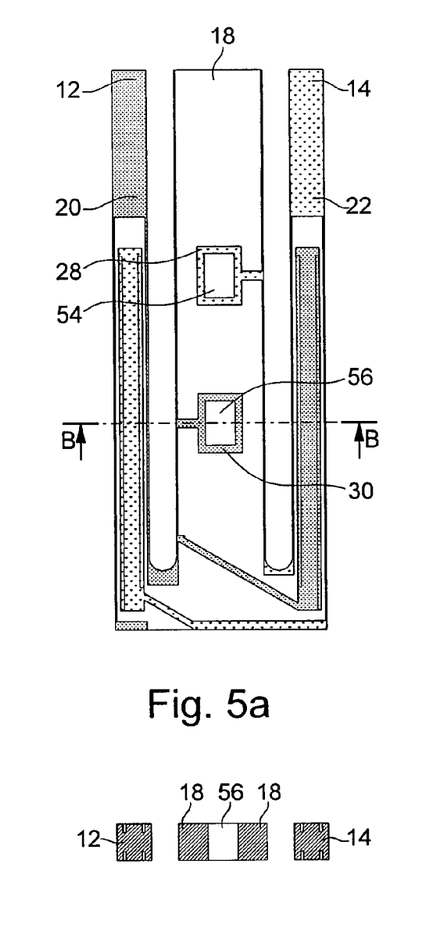
FIGS. 5a and 5b are bottoms views of two variants of a fifth embodiment of a piezoelectric resonator according to the invention.
Figure 5B:
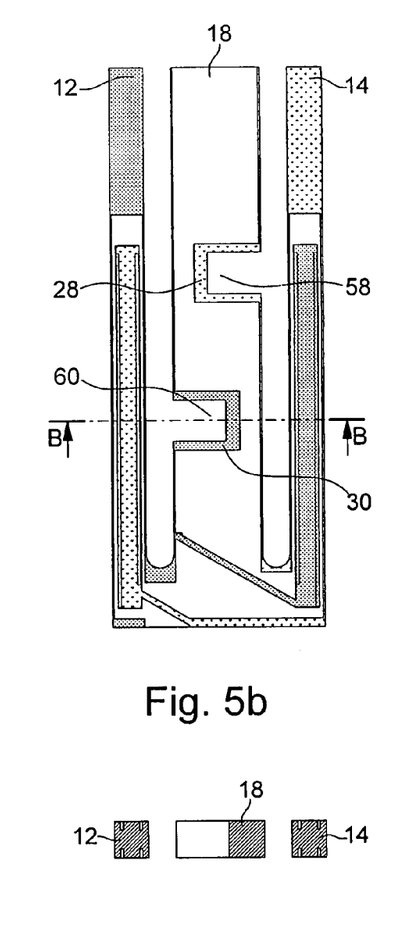

In the two variants of the fifth embodiment respectively shown in FIGS. 5a and 5b, the resonator differs from the one shown in relation with FIG. 4 in that fixing and positioning means are arranged on central arm 18. According to this fifth embodiment, a double goal has been sought; guarantee an accurate positioning and a robust fixing of resonator 10 inside its packaging. For that purpose, according to a first variant shown in FIG. 5a, fixing and positioning holes 54 and 56 have been cut through central arm 18, these holes being preferably used also to connect the group of electrodes 20 and 22 of resonator 10 to conductive elements inside the packaging (not shown). Since these holes 54 and 56 have been cut through central arm 18, one may accurately positioned resonator 10 inside the packaging (not shown) by looking to marks designed on the bottom of said packaging. Furthermore, during the assembly of the resonator inside its packaging, holes 54, 56 are filled in with conductive glue that allows on the one hand electrically connecting electrodes 20, 22 to conductive elements inside the packaging (not shown) and on the other hand solidly fixing resonator 10 inside its packaging. As an alternative to this first variant of FIG. 5a, one may provide with blind holes located on the back face of the central arm, i.e. the one supporting conductive elements 28 and 30. Positioning of the resonator can then be made by guiding these blind holes along corresponding bumps in the case.

According to the second variant shown in FIG. 5b, fixing and positioning recesses 58 and 60 have been cut on both sides of central arm 18 facing both vibrating arms 12 and 14, of the resonator. As for the holes of FIG. 5a, these recesses 58, 60 have been cut through the whole depth of central arm 18 and thus allow accurate positioning in the packaging with respect to marks made on the bottom of it and robust fixing by adding conductive glue so that to fill in said recesses. It will be appreciated that holes 54, 56 as well as recesses 58, 60 may have several shapes, such as square, circle or polygonal ones.

Figure 6A:
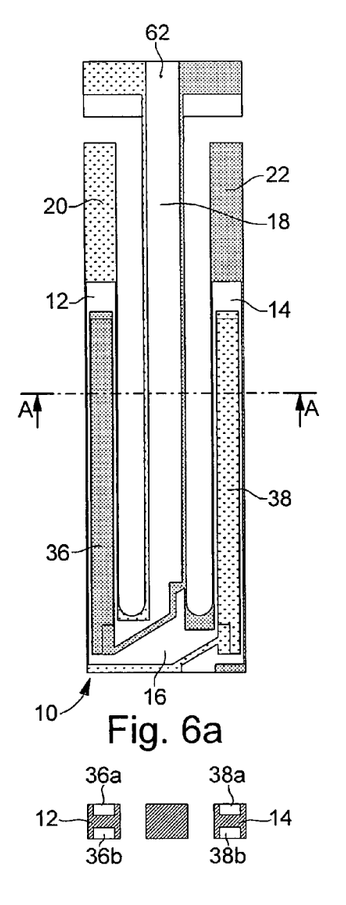
FIGS. 6a and 6b are bottom views of two variants of a sixth embodiment of a piezoelectric resonator according to the invention.
Figure 6B:
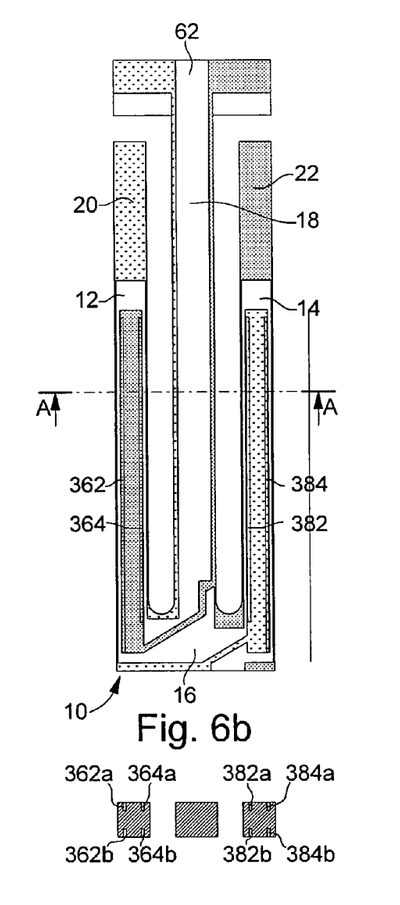

In the two variants of the sixth embodiment respectively shown in FIGS. 6a and 6b, the resonator differs respectively from the second and fourth embodiments shown in FIGS. 2a and 4, in that central arm 18 has a narrowed width so that it is about the same to that of one vibrating arm. Though such a thin central arm 18 reduces the width of the overall resonator structure and may be packaged in a thinner packaging (not shown), it may not be used any longer as fixing part for resonator 10. Therefore, a base part 62 is provided at the end of the central arm opposite to linking part 16 and extends beyond vibrating arms 12 and 14. This base part 62 is used both for fixing resonator 10 inside its packaging and for electrically connecting electrodes 20 and 22 of the resonator to conductive elements inside the packaging (not shown). FIG. 6a shows a first variant with a single groove 36, respectively 38 hollowed out on each the front (36a respectively 38a) and rear (36b, respectively 38b) sides of each vibrating arm 12, respectively 14. Each groove 36, respectively 38 extends in linking part 16 and has a non symmetrical shape within said linking part so that to increase the mechanical resistance of the resonator structure in the high mechanical stressed areas. FIG. 6b shows a second variant with two grooves 362 and 364, respectively 382 and 384 hollowed out on each the front (362a, 364a, respectively 392a, 384a) and rear (362b, 364b, respectively 382b, 384b) sides of each vibrating arm 12, respectively 14. Grooves 362, 364, 382 and 384 extend within linking part 16. Outside grooves 362, respectively 384 with respect to central arm 18 extend longer than inside ones 364, respectively 382 to reinforce the mechanical resistance in the high stressed areas.

Figure 7A:
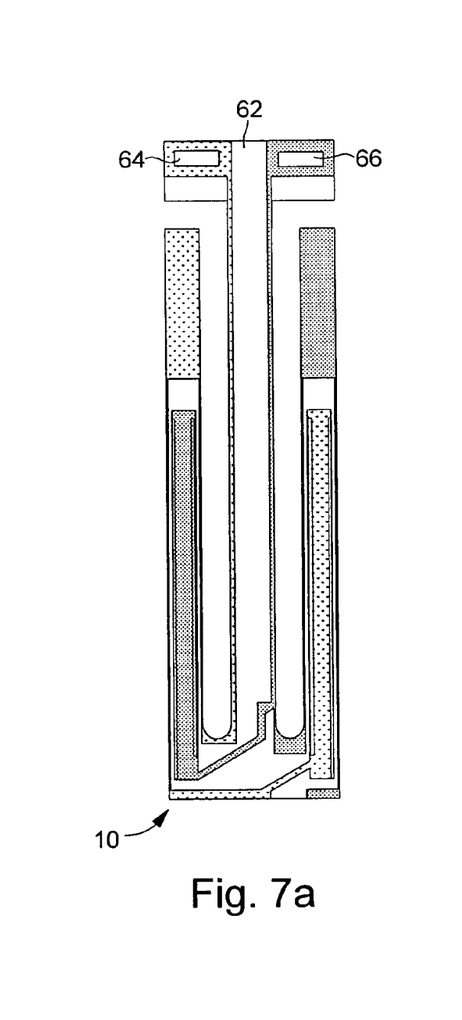
FIGS. 7a and 7b are bottom views of two variants of a seventh embodiment of a piezoelectric according to the invention.
Figure 7B:
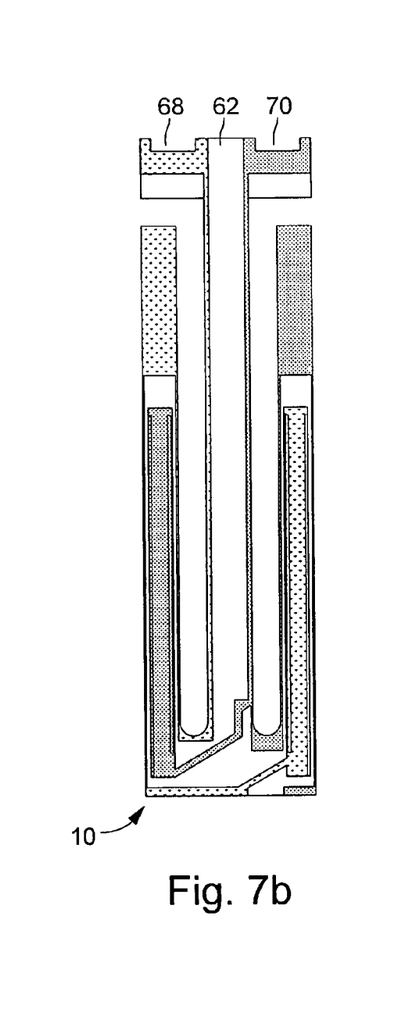

In the seventh embodiment shown in FIGS. 7a and 7b, the resonator differs from the sixth one in that fixing and positioning holes or recesses are arranged in the base part in order to guarantee an accurate positioning and solid fixing of the resonator inside its packaging. FIG. 7a shows a first variant wherein holes 64 and 66 have been cut through base part 62. Thus, when assembling one may see through said holes 64 and 66 marks provided on the bottom of the packaging (not shown) for accurately positioning resonator 10 in its packaging. Further, filling in holes 64 and 66 with glue guarantees a solid fixing of the resonator inside its packaging. FIG. 7b shows a second variant wherein recesses 68 and 70 have been cut through on the opposite side of base part 62 with respect to central arm 18 to which it is attached. Recesses 68 and 70 present similar advantages as holes 64 and 66. Use of conductive glue for fixing base part 62 to the packaging allows connecting electrodes 20 and 22 to conductive elements inside the packaging (not shown).

Figure 8A:
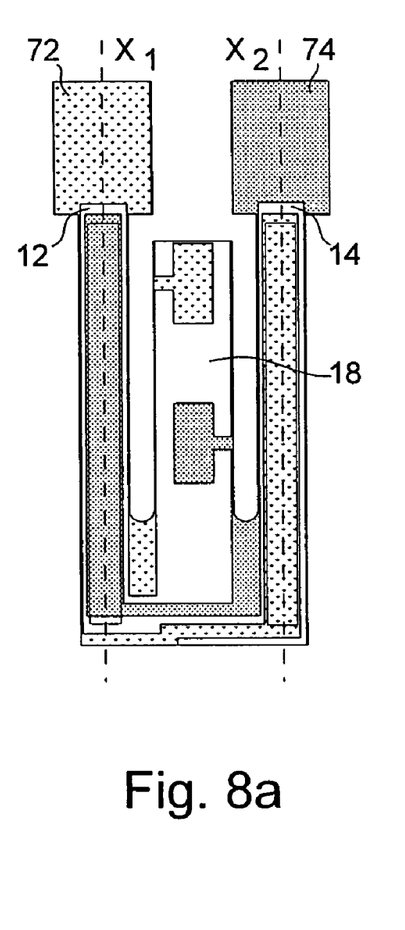
FIGS. 8a and 8b are bottom views of four variants of an eighth embodiment of a piezoelectric resonator according to the invention.
Figure 8B:
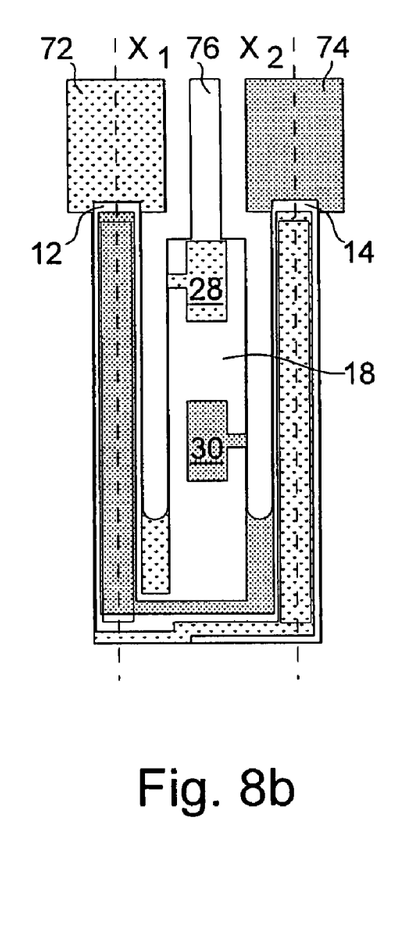

In the eighth embodiment shown in FIGS. 8a and 8b, the resonator differs from the first one in that, on the one hand, the length of central arm 18 is less than that of vibrating arms 12 and 14 and, on the other hand, each vibrating arm 12, respectively 14, ends in a flipper 72, respectively 74, which extends beyond central arm 18. Preferably, these flippers 72 and 74 have a symmetrical rectangular shape with respect to the longitudinal axis ($X_1$, $X_2$) of corresponding vibrating arm 12, 14, the flipper width being approximately twice as that of vibrating arm. But in counterpart, it will appreciated that the flipper length can be deduced from the overall length of the vibrating arm without modifying the resonator properties and therefore the resonator length may be reduced accordingly. According to a second variant shown in FIG. 8b, a balancing reed 76 has been attached to the central arm end opposite to linking part 16. This balancing reed 76 is located between both flippers 72, 74 of vibrating arms 12, 14 and has a thinner width than that of central arm 18 to let both vibrating arms 12, 14 vibrate without any risk of collisions with them. Moreover reed 76 does not extend beyond flippers 72, 74 along the longitudinal axis of the resonator structure in order to keep the whole resonator length as short as possible. With such a reed 76, better stabilization of the resonator structure is obtained when vibrating and thus fewer mechanical stresses are constrained on fixing parts 28, 30.

Figure 9A:
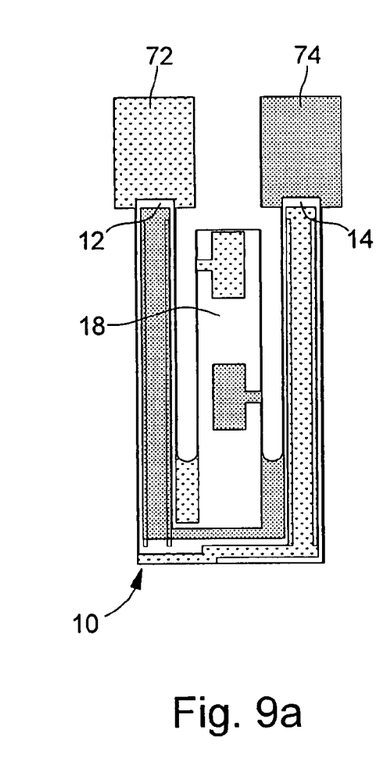
FIGS. 9a, 9b, 9c and 9d are bottom views of two variants of a ninth embodiment of a piezoelectric resonator according to the invention.
Figure 9B:
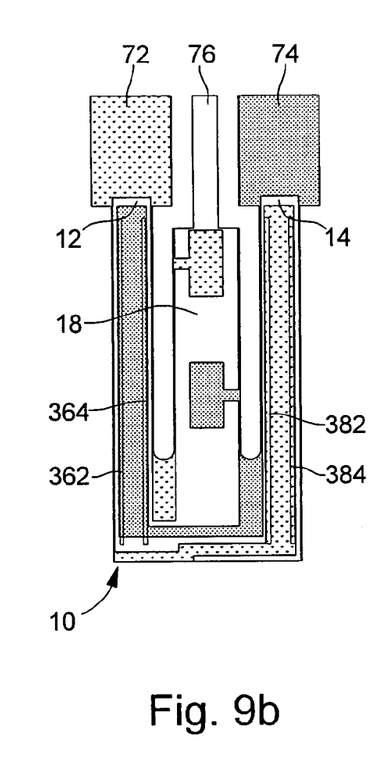
Figure 9C:
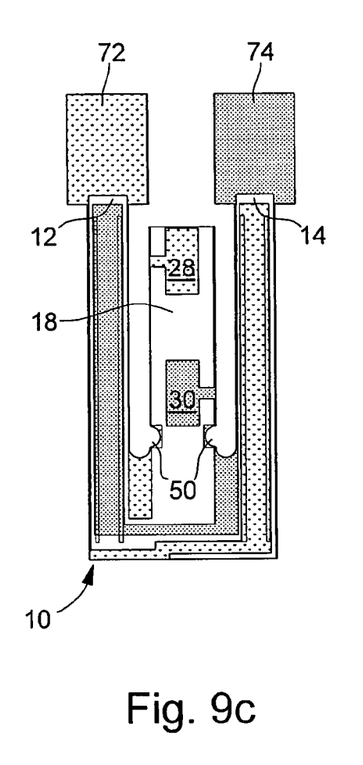
Figure 9D:
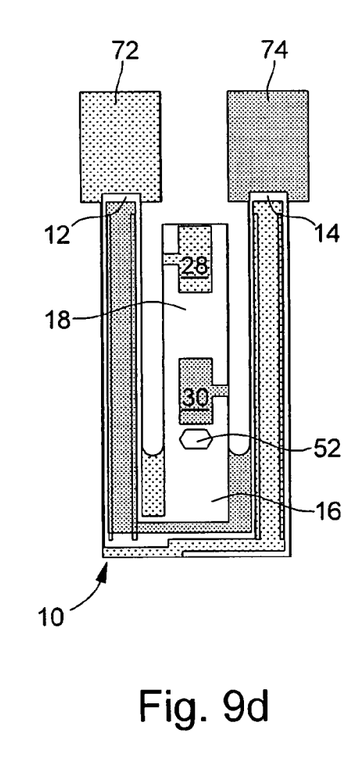

In the ninth embodiment shown in FIGS. 9a, 9b, 9c and 9d, the resonator differs from the eighth one in that two grooves 362, 364, 382 and 384 are provided on both the front and rear sides of each vibrating arm 12, 14. FIG. 9a shows a first variant wherein the central arm length is shorter than that of the vibrating arms and wherein flippers 72, 74 extending beyond central arm 18 are arranged at the end of vibrating arms 12, 14 for reducing overall length of resonator 10 without altering its properties. FIG. 9b shows a second variant wherein resonator 10 further comprises a balancing reed 76 protruding from central arm 18 and extending between both vibrating arms 12, 14. This reed 76 allows stabilizing the resonator while vibrating. FIG. 9c shows a third variant wherein notches 50 are arranged on central arm 18 between fixing elements 28, 30 and linking part 16 in order to mechanically decouple said central arm by which resonator 10 is fixed to its packaging, from vibrating arms 12, 14. FIG. 9d shows a fourth variant which is an alternative to the third one, wherein instead of providing central arm 18 with notches, a hole 52 has been cut through central arm 18 between fixing elements 28, 30 and linking part 16.

It will be appreciated that many other variants not shown may be implemented. Among with variants wherein fixing and positioning holes or alternatively fixing and positioning recesses are provided through the central arm as defined in relation with the fifth embodiment above described.

Figure 10A:
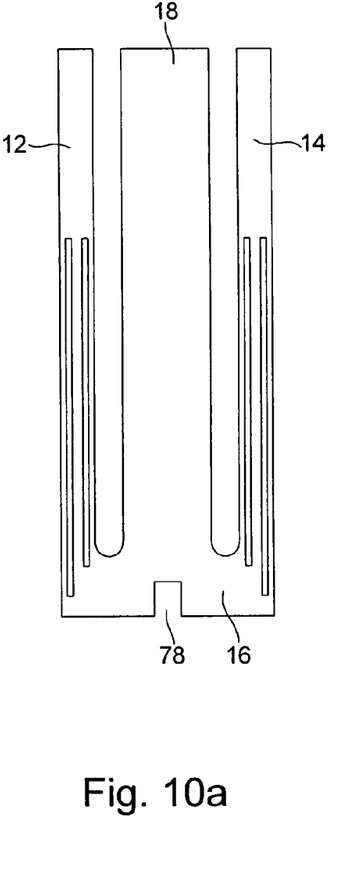
FIGS. 10a, 10b and 10c are bottom views of three variants of a tenth embodiment of a piezoelectric resonator according to the invention.

In the first variant of the tenth embodiment shown in FIG. 10a, the resonator differs from the fourth embodiment in that one notch 78 is provided within linking part 16 on the opposite side to the one on which central arm 18 is protruding from. This recess 78 has the advantage of mechanically decoupling central arm 18 from both vibrating arms 12, 14 without weakening the resonator structure.

Figure 10B:
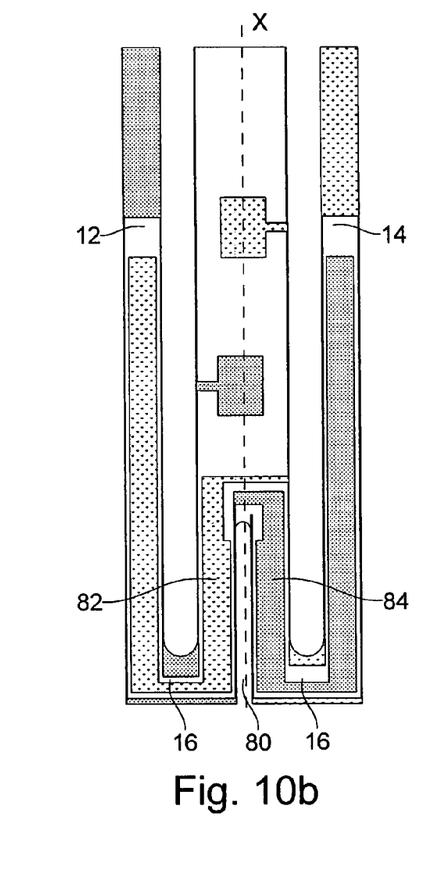

In the second variant of the tenth embodiment shown in FIG. 10b, the resonator differs from the first embodiment of FIG. 1a in that a slot 80 is provided within linking part 16 on the opposite side to the one on which central arm 18 is protruding from and preferably along the longitudinal axis X of the resonator. This slot 80 has for effect to virtually lengthen vibrating arms 12, 14 to the corresponding half of linking part 16. For further optimizing the vibrating coupling effect of the vibrating arms by retrieving the electrical field in all high stressed areas of the cut linking part, additional electrodes 82, 84 are arranged along slot 80. Advantageously grooves have been hollowed out under electrodes 82, 84 to produce an excitation electrical field which is more homogeneous and locally more intense. Thus, for a determined frequency, use of these electrodes 82, 84, preferably grooved, allows the overall length of the resonator to be reduced.

Figure 10C:
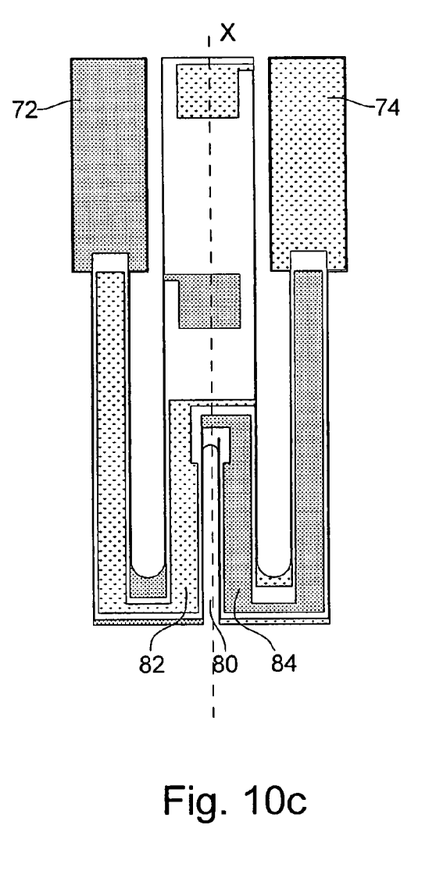

In the third variant shown in FIG. 10c, the resonator differs from the second variant above described in that flippers 72, 74 have been arranged as described in relation with FIG. 8a in order to further reduce the overall length of the resonator.

Figure 11:
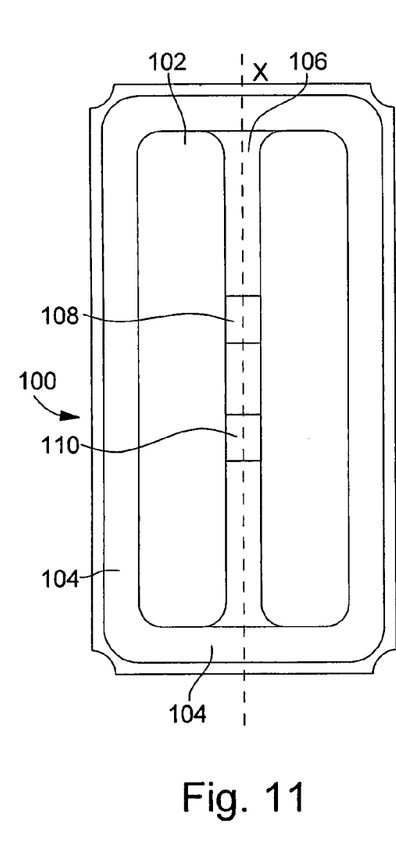
FIG. 11 is a top view of a suitable package for receiving a piezoelectric resonator according to the invention.

FIG. 11 is a top view of a suitable package without its cover for receiving a piezoelectric resonator according to the invention. It is understood that the size of the packaging is adjusted in function of the general shape of the resonator structure which may vary according to the embodiment considered. Case 100 of parallelepiped shape includes a main part formed by a flat bottom 102 and four sides 104 and a cover with an edge (not shown) via which the cover is vacuum soldered, on sides 104 of the main part, by heating and pressure, by means of a soldering frame (also not shown), after the resonator has been mounted in case 100. Additionally, a central rib 106 has been arranged on bottom 102 of case 100, which rib 106 extends along the longitudinal axis X in order to support fixing parts of the resonator. The rib width is chosen so that vibrating arms of the resonator may vibrate freely inside case 100. On rib 106 two conductive elements, such as thin conductive layers, studs or bumps 108 and 110, are arranged for contacting the corresponding conductive pads of the resonator. It will be appreciated that rib 106 shall not extend from one side 104 to the opposite one.

Figure 12A:
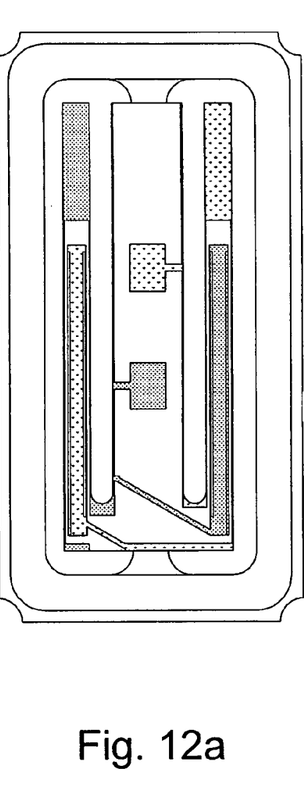
FIGS. 12a, 12b and 12c are top views of a piezoelectric resonator mounted in a suitable package according respectively to the fourth and fifth embodiments.
Figure 12B:
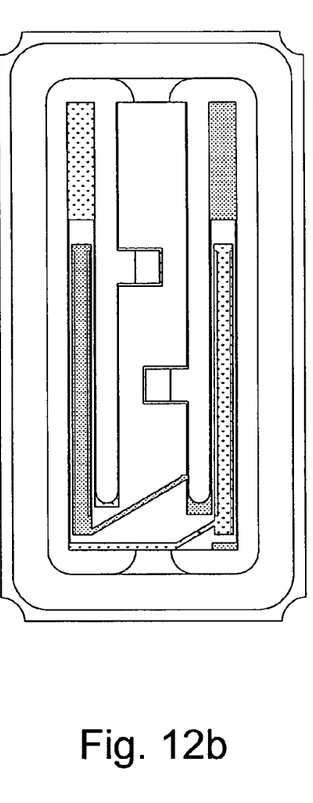
Figure 12C:
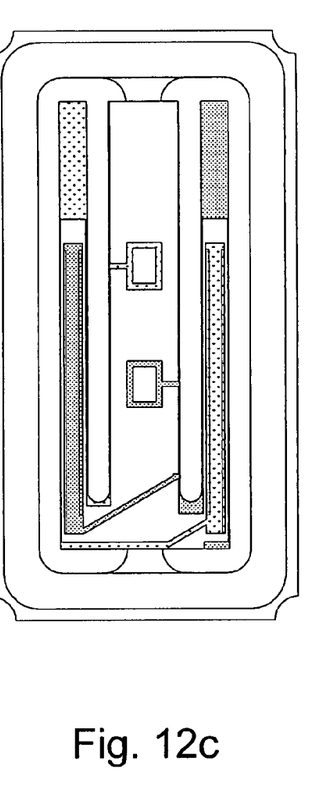

FIGS. 12a, 12b and 12c are different opened top views of a piezoelectric resonator 10 according respectively to the fourth and fifth embodiments mounted in a suitable package 100. FIG. 12a shows a top view with a resonator according to the fourth embodiment in which central arm 18 supports conductive pads 28 and 30 to be connected to the corresponding conductive elements arranged on rib 106. The mounting of the resonator is achieved by soldering or gluing with a conductive adhesive its connection pads 28 and 30 onto respective thin layers, studs or bumps.

In any case, the fact of fixing the resonator to the bottom of the case, in the zone of its centre of gravity, makes the assembly thereof easier and minimises the risk of it tipping during such assembly. For the same reason the shock resistance of the encased resonator is much higher.

FIGS. 12b and 12c show top views with resonators according to both variants of the fifth embodiment. Advantageously in these two variants in order to guarantee an accurate positioning of the resonator when mounting it inside its packaging 100, conductive elements 108 and 110 may be seen through holes 54, 56 or recesses 58, 60 cut through central arm 18.

It will be appreciated that preferably for further improving the shock resistance of the resonators according to any of the above presented embodiments, the cut out portions where vibrating arms are linked to the linking part are advantageously chosen to minimize visualisation of the crystalline planes of the resonator. In the example of a quartz resonator, the cut out portions form angles of approximately 60° or 120°.

Having described the invention with regard to certain specific embodiments, it is to be understood that these embodiments are not meant as limitations of the invention. Indeed, various modifications, adaptations and/or combination between embodiments may become apparent to those skilled in the art without departing from the scope of the annexed claims.

What is claimed is:

1. A piezoelectric resonator including a tuning fork shaped part with two parallel vibrating arms, connected to each other by a linking part, from which protrudes a central arm located between both vibrating arms of the tuning fork shaped part, wherein at least one groove is formed on each of a front side and a rear side of each vibrating arm, and
   wherein a portion of each groove of said vibrating arms extends in said linking part.

2. The resonator according to claim 1, wherein said portion within said linking part has a part with a narrowed width compared to that of the groove, and wherein said part is located on the outside with respect to said central arm.

3. A piezoelectric resonator including a tuning fork shaped part with two parallel vibrating arms, connected to each other by a linking part, from which protrudes a central arm located between both vibrating arms of the tuning fork shaped part, wherein two grooves are formed on each of a front side and a rear side of each vibrating arm, and wherein said grooves of each vibrating arm extend in said linking part.

4. The resonator according to claim 3, wherein exterior grooves which are located on the outside with respect to said central arm, extend farther within the linking part than interior grooves which are located on the inside with respect to said central arm.

5. The resonator according to claim 1, wherein the width of said central arm is greater or equal to one and a half the width of said vibrating arms and wherein said central arm does not extend beyond said vibrating arms.

6. The resonator according to claim 1, wherein the width of said central arm is about the same as that of said vibrating arms and wherein a base part protrudes from said central arm opposite to said linking part.

7. The resonator according to claim 6, wherein fixing holes have been cut through said base part.

8. The resonator according to claim 6, wherein fixing recesses have been arranged in said base part.

9. The resonator according to claim 6, wherein fixing blind holes have been cut in said base part.

10. The resonator according to claim 1, wherein fixing holes have been cut through said central arm.

11. The resonator according to claim 10, wherein said fixing holes are used for positioning said resonator inside its packaging.

12. The resonator according to claim 1, wherein fixing blind holes have been cut in said central arm.

13. The resonator according to claim 1, wherein fixing recesses have been arranged on both sides of said central arm facing said vibrating arms.

14. A piezoelectric resonator including a tuning fork shaped part with two parallel vibrating arms, connected to each other by a linking part, from which protrudes a central arm located between both vibrating arms of the turning fork shaped part, wherein at least one groove is formed on at least one of a front side and a rear side of each vibrating arm, wherein the length of said central arm is less than that of the vibrating arms, wherein said vibrating arms end in flippers extending beyond said central arm, said flippers having a width larger than that of said vibrating arms, and wherein a balancing reed attached to said central arm extends between both flippers, and has a width smaller than that of said central arm.

15. The resonator according to claim 1, wherein a decoupling hole has been cut through said central arm.

16. The resonator according to claim 1, wherein decoupling notches have been arranged on both sides of said central arm facing said vibrating arms.

17. The resonator according to claim 1, wherein a notch is arranged in said linking part opposite to said central arm.

18. The resonator according to claim 1, wherein a slot has been arranged within said linking part opposite to said central arm and wherein additional electrodes have been arranged along said slot.

19. The resonator according to claim 18, wherein grooves have been hollowed out under said additional electrodes.

20. The resonator according to claim 1, wherein said grooves have a depth between 40% and 50% of the thickness of said vibrating arms in the depth direction.

* * * * *